(12) United States Patent
Miyashita

(10) Patent No.: US 8,144,970 B2
(45) Date of Patent: Mar. 27, 2012

(54) DETERMINING METHOD AND APPARATUS, EXPOSURE APPARATUS, AND DEVICE MANUFACTURING METHOD

(75) Inventor: Tomoyuki Miyashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 911 days.

(21) Appl. No.: 11/339,714

(22) Filed: Jan. 26, 2006

(65) Prior Publication Data

US 2006/0177146 A1    Aug. 10, 2006

(30) Foreign Application Priority Data

Feb. 4, 2005    (JP) .................................. 2005-029829

(51) Int. Cl.
*G06K 9/40*    (2006.01)
*G06K 9/62*    (2006.01)
*G06K 9/00*    (2006.01)

(52) U.S. Cl. .......................... 382/145; 382/141; 382/255

(58) Field of Classification Search .................. 382/141, 382/145, 255
See application file for complete search history.

(56) References Cited

U.S. PATENT DOCUMENTS

| | | | | |
|---|---|---|---|---|
| 4,650,983 A * | 3/1987 | Suwa | ............................ | 250/204 |
| 5,331,370 A * | 7/1994 | Rosner et al. | .................. | 355/53 |
| 5,629,772 A * | 5/1997 | Ausschnitt | .................... | 356/625 |
| 5,757,507 A | 5/1998 | Ausschnitt et al. | ........... | 356/401 |
| 5,790,254 A | 8/1998 | Ausschnitt | .................... | 356/372 |
| 6,137,578 A | 10/2000 | Ausschnitt | .................... | 356/399 |
| 6,577,406 B2 | 6/2003 | Bruce et al. | .................... | 356/625 |
| 7,295,695 B1 * | 11/2007 | Dayal | ........................... | 382/145 |
| 2002/0048006 A1 * | 4/2002 | Mishima | ......................... | 355/53 |
| 2004/0241558 A1 * | 12/2004 | Garcia et al. | ...................... | 430/5 |
| 2005/0051742 A1 * | 3/2005 | Shiraishi | ....................... | 250/548 |
| 2005/0074160 A1 | 4/2005 | Miyashita | ..................... | 382/151 |
| 2005/0084782 A1 * | 4/2005 | Sentoku | .......................... | 430/30 |
| 2005/0154562 A1 * | 7/2005 | Matsuura et al. | ............. | 702/185 |
| 2005/0281454 A1 | 12/2005 | Miyashita | ..................... | 382/145 |
| 2006/0103825 A1 * | 5/2006 | Kondo | ............................. | 355/55 |
| 2006/0177146 A1 | 8/2006 | Miyashita | ..................... | 382/255 |

* cited by examiner

*Primary Examiner* — Brian Werner
*Assistant Examiner* — Nirav G Patel
(74) *Attorney, Agent, or Firm* — Fitzpatrick, Cella, Harper & Scinto

(57) ABSTRACT

A method of determining a defocus direction of a pattern image formed on a reticle, which is projected by an exposure apparatus onto a resist on a substrate as a resist pattern, the exposure apparatus exposing the resist to light via the pattern image on the reticle to form the resist pattern. The method includes an image capturing step of capturing a resist image of the resist pattern that is formed on the substrate by the exposure apparatus, to obtain image data, an extracting step of extracting a feature of the image data to obtain feature data, and a determining step of determining the defocus direction of the pattern image based on the extracted feature data. The resist pattern includes a dual tone line end shortening target having a hollow grating mark and a solid grating mark, and the feature data includes an edge sharpness of a waveform of the image data.

12 Claims, 14 Drawing Sheets

F I G. 2
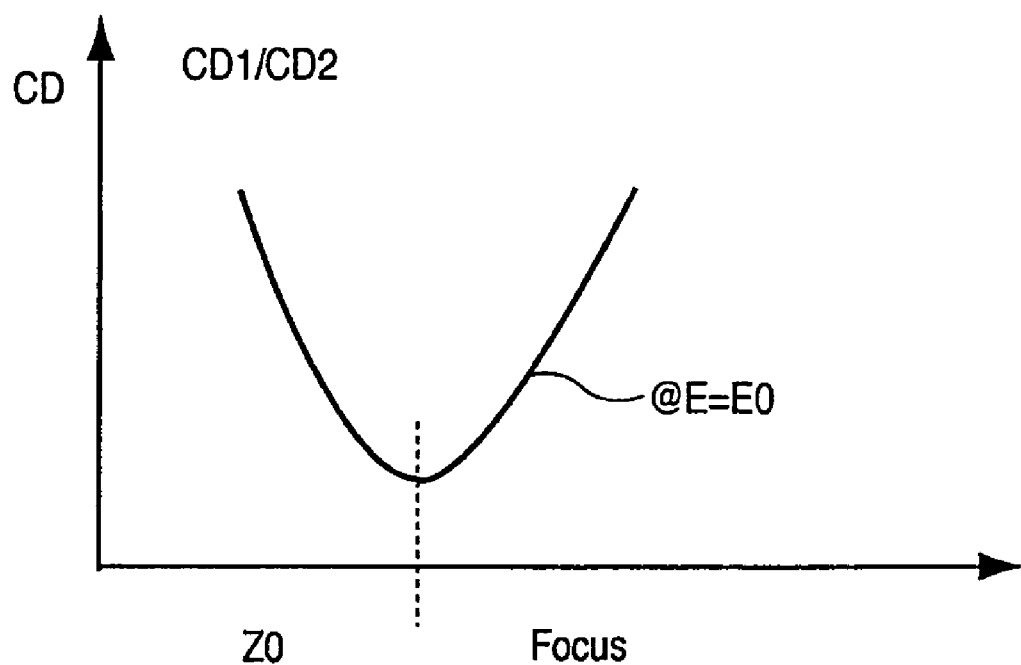

FIG. 11

| DRAM GENERATION | REQUIRED ACCURACY OF DRAM GENERATION | | REQUIRED ACCURACY OF OVERLAY INSPECTION APPARATUS |
|---|---|---|---|
| | DESIGN RULE | REQUIRED OVERLAY ACCURACY | |
| 256M | 0.25μm | 85nm | 8.5nm |
| 1G | 0.18μm | 65nm | 6.5nm |
| 4G | 0.13μm | 45nm | 4.5nm |
| 16G | 0.10μm | 35nm | 3.5nm |

DETERMINING METHOD AND APPARATUS, EXPOSURE APPARATUS, AND DEVICE MANUFACTURING METHOD

This application claims the benefit of Japanese Patent Application No. 2005-029829, filed on Feb. 4, 2005, which is hereby incorporated by reference herein in its entirety.

FIELD OF THE INVENTION

The present invention relates to a technique applied to lithography and, more particularly, to a technique of determining the defocus direction of an image formed on a resist by an exposure apparatus for exposing a resist on a substrate to light via a pattern of a reticle.

BACKGROUND OF THE INVENTION

In semiconductor manufacture lithography, in which a reticle pattern is projected and transferred onto a wafer by exposing the pattern using exposure light, an apparatus for inspecting the exposure and defocus amount is used.

The conventional flow of lithography will be described.

A resist pattern is formed by applying a resist, serving as a photosensitizer to a substrate, such as a semiconductor wafer, projecting a mask pattern on the resist by exposure using an exposure apparatus, and then, developing the resist.

The dimensions of the formed resist pattern are checked by a scanning electron microscope (measuring SEM or CD-SEM) with a measuring function. The conventional processing contents of the measuring SEM include, e.g., acquiring an electron beam image of an area containing parts with strict dimensional accuracy (step 1), measuring the dimensions (step 2), determining whether the dimensions meet the standards (step 3), and, if not, changing the exposure of the exposure apparatus (step 4, the exposure correction amount is ΔE). For, e.g., a positive resist, if the resist dimensions are too large, the exposure is increased. If the resist width is too small, the exposure is decreased.

The relationship between a resist pattern and a film pattern after etching will be described next.

The shape of a resist pattern and the shape of a film pattern have a predetermined relationship if the etching conditions are the same. To obtain a film pattern having a predetermined shape, the resist pattern must have a predetermined shape, too. In, e.g., starting a new process, a wafer called an FEM (Focus Exposure Matrix) is prepared by exposing a pattern while changing the focus and exposure in each shot (one exposure cycle). A focus and exposure to obtain a predetermined resist pattern shape are found by measuring the dimensions of the resist pattern in each shot, and cutting the wafer to check its sectional shape. That is, a so-called "condition determination" is performed.

With this operation, the exposure (E0) and focus value (F0) to widen the margin are determined. Product wafers are exposed on the basis of these conditions. However, it may be impossible sometimes to obtain a resist pattern with a predetermined shape under the conditions (E0, F0) determined by the "condition determination," because of various process variations (e.g., a change in resist sensitivity, a variation in thickness of an antireflection film under the resist, or a drift of various kinds of sensors of the exposure apparatus). This is detected in dimension measurement (step 2). In the conventional technique, the change in resist shape caused by process variations is compensated for by correcting the exposure.

KLA-Tencor in the United States announced, on Jun. 24, 2003, an "MPX" that enables in-line focus/exposure monitoring as a new option of an overlay measuring apparatus in their "Archer" series. The "MPX" can monitor the focus and exposure by analyzing a unique dual tone line end shortening (LES) target and accurately separating the focus and the exposure. On the basis of the data, management of the defocus and exposure of the exposure apparatus, grasping the apparatus variation, and specifying the cause can be done quickly. KLA-Tencor states that users can suppress any decrease in yield associated with focus, and save the cost of millions of dollars a year by using that option. Techniques related to such a measuring apparatus are disclosed in U.S. Pat. No. 5,629,772, U.S. Pat. No. 5,757,507, U.S. Pat. No. 5,790,254, U.S. Pat. No. 6,137,578, and U.S. Pat. No. 6,577,406.

In the prior art, to detect and to cope with process variations, dimensional values, such as a line width are checked by using measuring SEM. If the dimensional values do not meet the standards, the exposure is corrected. However, this method has the problem of focal depth degradation described below.

When the exposure changes, the line width changes. On the other hand, the line width rarely changes, even when the focus changes. However, when the focus changes, the sectional shape of the resist changes, although the line width does not change. As described above, the change in sectional shape influences the shape of the film pattern after etching. For this reason, since the prior art is incapable of detecting a focus variation, poor film pattern shapes may be produced in large quantities after etching.

As described above, since displacement caused by defocus cannot be corrected by correcting only the exposure, the resist can have no normal sectional shape. In addition, since exposure is not executed at the center of the depth of focus, the depth may be insufficient, and poor film pattern shapes may be produced in large quantities after etching.

In "MPX", the focus amount and exposure are estimated by analyzing a dual tone line end shortening target (to be referred to as a mark, hereinafter). The mark includes a hollow grating mark and a solid grating mark, as shown in FIG. 1. Conventionally, the focus amount and exposure are estimated by measuring intervals CD1 and CD2 shown in FIG. 1. The defocus amount is estimated by using the behavior of the interval CD1 or CD2, which changes with respect to the focus amount, as shown in FIG. 2.

FIG. 2 shows the relationship between the interval CD1 or CD2 and the focus amount at an exposure E=E0. The interval CD1 or CD2 is plotted along the ordinate, and the focus amount is plotted along the abscissa. Z0 is the optimum focus amount. The interval CD1 or CD2 is minimized when the focus amount is Z0. However, the interval CD1 or CD2 changes as an even function with respect to the defocus amount. For this reason, the interval is usable in estimating the defocus amount, but not usable in estimating the defocus direction (i.e., whether the defocus occurs in the positive direction or the negative direction).

SUMMARY OF THE INVENTION

It is an object of the present invention to provide a novel technique of determining the focus direction of an image formed on a resist by an exposure apparatus based on a resist pattern formed through an exposure of the resist to the image.

In order to achieve the object, according to a first aspect of the present invention, a method of determining a defocus direction of a pattern image formed on a resist by an exposure apparatus for exposing a resist on a substrate to light via a pattern of a reticle, comprises an image capturing step of capturing a resist image of a resist pattern formed through exposure of a resist to the pattern image by the exposure apparatus, to obtain image data, an extracting step of extracting a feature of the image data to obtain feature data, and a determining step of determining the defocus direction based on the feature data.

According to the above aspect, the extracting step includes a differentiating step of differentiating the image data to obtain differential image data.

According to the above aspect, the extracting step includes a calculating step of calculating a power spectrum of the differential image data as the feature data.

According to the above aspect, in the determining step, the determining step determines the defocus direction based on the feature data and feature data obtained in advance from a resist pattern whose defocus direction is known.

According to the above aspect, the determining step determines the defocus direction by projecting the feature data of the image data to probability space data, which has been obtained by projecting the feature data obtained in advance, to one of a Mahalanobis space and a Bayes space.

According to the above aspect, the probability space data is prepared with respect to each of two directions of defocus.

According to the above aspect, the determining step determines the defocus direction based on two probability data obtained by projecting the feature data of the image data to each of the probability space data.

According to the above aspect, the feature data obtained in advance are obtained with respect to a plurality of resist patterns, the resist patterns being obtained with respect to a plurality of values of at least one of a defocus amount and a dose of the exposure.

According to a second aspect of the present invention, an apparatus, for determining a defocus direction of a pattern image formed on a resist by an exposure apparatus for exposing a resist on a substrate to light via a pattern of a reticle, comprises a camera configured to capture a resist image of a resist pattern formed through exposure of a resist to the pattern image by the exposure apparatus to obtain image data, and a processor configured to extract a feature of the image data and to obtain feature data, and to determine the defocus direction based on the feature data.

According to the above aspect, the processor is configured to differentiate the image data to obtain differential image data.

According to the above aspect, the processor is configured to calculate a power spectrum of the differential image data as the feature data.

According to the above aspect, the processor is configured to determine the defocus direction based on the feature data, and feature data obtained in advance, from a resist pattern whose defocus direction is known.

According to the above aspect, the processor is configured to determine the defocus direction by projecting the feature data of the image data to probability space data, which has been obtained in advance, to one of a Mahalanobis space and a Bayes space.

According to the above aspect, the processor is configured to store the probability space data with respect to each of two directions of defocus.

According to the above aspect, the processor is configured to determine the defocus direction based on two probability data obtained by projecting the feature data of the image data to each of the probability space data.

According to the above aspect, the feature data obtained in advance are obtained with respect to a plurality of resist patterns, the resist patterns being obtained with respect to a plurality of values of at least one of a defocus amount and a dose of the exposure.

An exposure apparatus for exposing a resist on a substrate to light via a pattern of a reticle comprises one of the above-described determining apparatuses.

A method of manufacturing a device comprises steps of exposing a resist on a substrate to light via a pattern of a reticle using an exposure apparatus as defined above, developing the exposed substrate, and processing the developed substrate to manufacture the device.

A device manufacturing method of the present invention comprises a step of determining a defocus direction of a pattern image formed on a resist by an exposure apparatus for exposing a resist on a substrate to light via a pattern of a reticle, using one of the above-described determining apparatuses.

According to the present invention, the defocus direction of the exposure apparatus can be determined from the resist pattern.

Other objects and advantages, besides those discussed above, shall be apparent to those skilled in the art, from the description of a preferred embodiment of the invention, which follows. In the description, reference is made to the accompanying drawings, which form a part hereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 2 is a graph showing the relationship between the focus amount and CD1 or CD2 shown in FIG. 1;
FIG. 11 is a table showing the minimum line width, required alignment accuracy, and required accuracy of the overlay inspection apparatus in each device node.

DETAILED DESCRIPTION OF THE PREFERRED EMBODIMENTS

[Outline of the Present Invention]

The outline of the present invention will be described with reference to the accompanying drawings.

Figure 1:
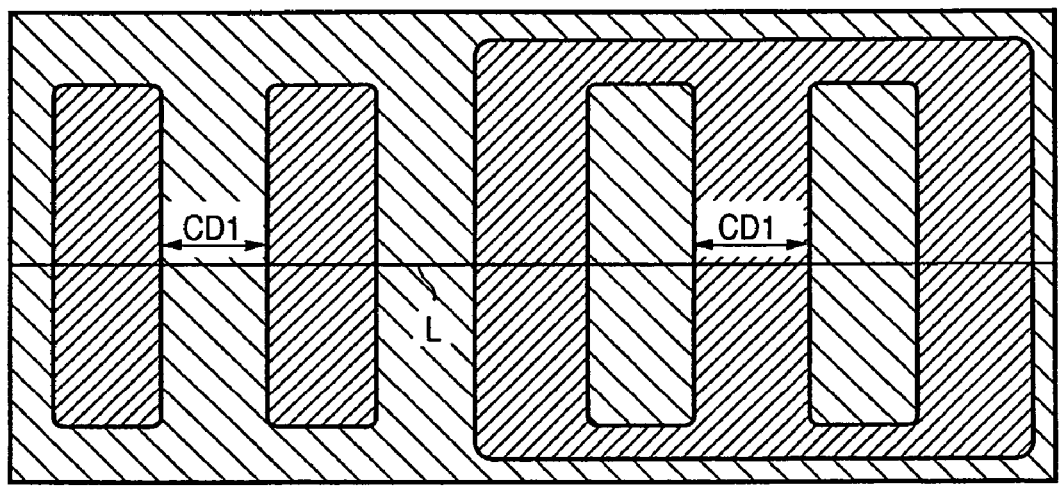
FIG. 1 is a view showing a mark (dual tone line end shortening target)
Figure 3:
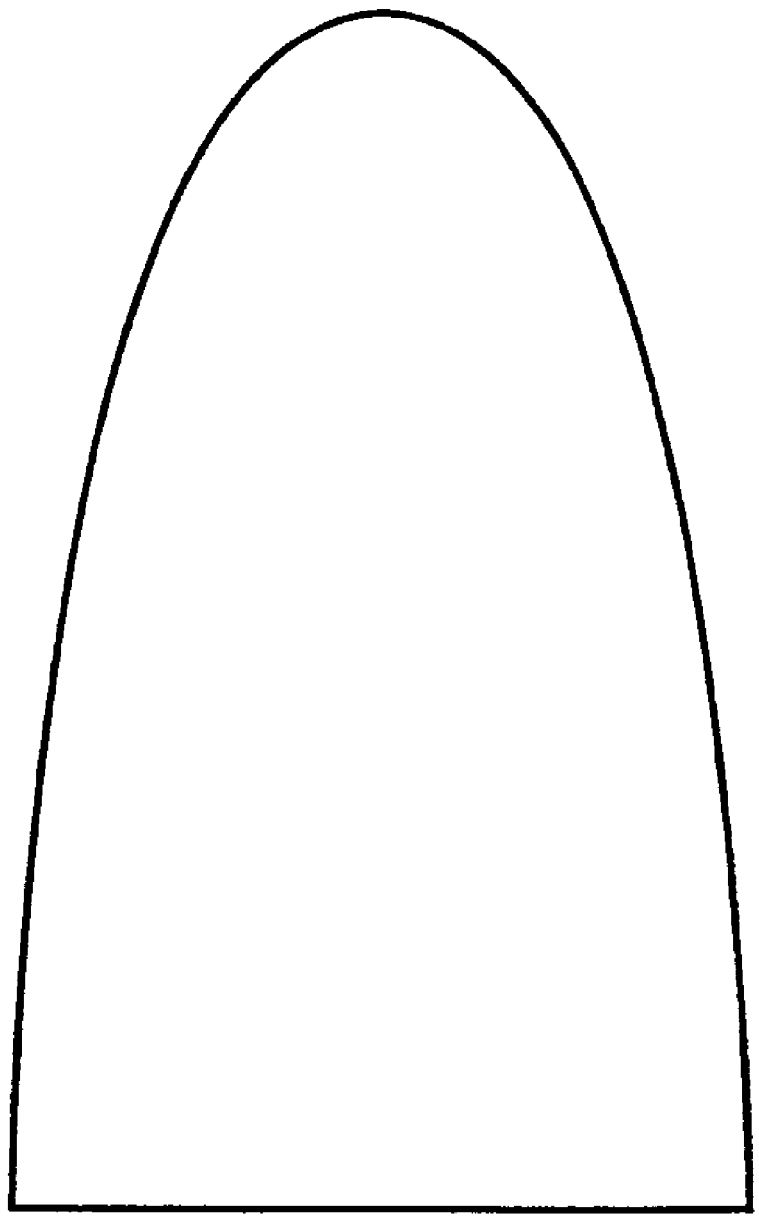
FIG. 3 is a schematic view of a waveform of negative focus.
Figure 4:
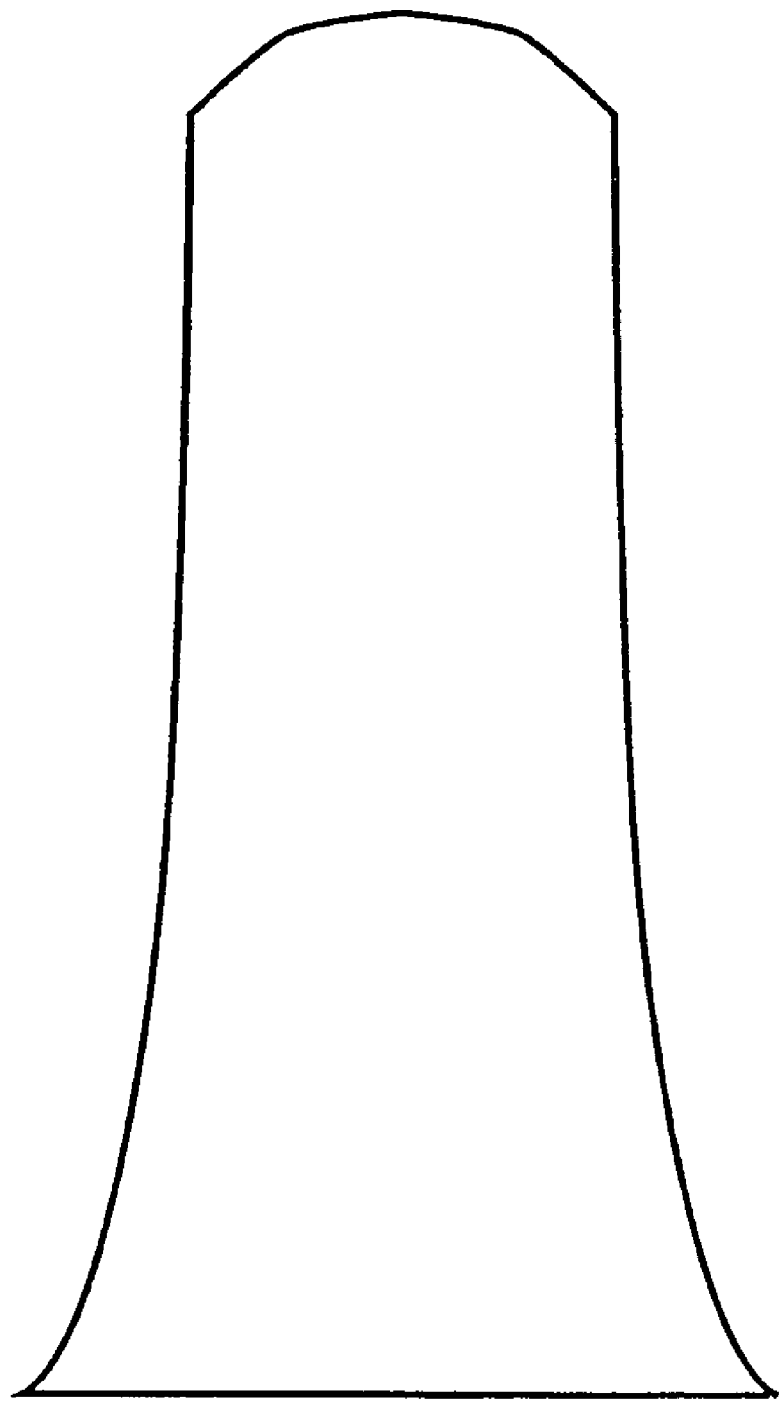
FIG. 4 is a schematic view of a waveform of positive focus.

In the present invention, the defocus direction is estimated by using not only a mark edge interval, such as an interval CD1 or CD2 shown in FIG. 1, but also, new feature information obtained from a waveform L shown in FIG. 1. According to "Yield Management Solutions" Fall 2001 and Winter 2002, issued by KLA-Tencor in the United States, the resist waveform changes between positive focus and negative focus. This tendency becomes noticeable as the defocus amount increases. FIGS. 3 and 4 show the resist waveform of positive focus and the resist waveform of negative focus, respectively, which have the same absolute value of defocus amount. FIG. 3 shows a negative focus. FIG. 4 shows a positive focus. That is, the shape or height changes.

An input/output (image capturing) means or step (input/output unit S701 in FIG. 7) receives unknown waveform data, which is obtained by capturing a mark at an unknown focus amount and exposure, positive focus waveform data obtained by exposure in a predetermined focus amount and exposure, and negative focus waveform data obtained by exposure in a predetermined focus amount and exposure. The input/output means or step also outputs the defocus direction of the unknown waveform determined by a determining means or step (to be described later).

A feature extracting means or step (feature extracting unit S703 in FIG. 7) extracts the difference in resist waveform between positive focus and negative focus. As a feature of the mark shown in FIG. 1, the positive focus waveform contains a larger number of sharp edges than the negative focus waveform. More specifically, the difference between positive focus and negative focus includes the edge sharpness and the interval between edges.

Edge components are extracted by differentiating the waveform (image data) (differentiated image data is obtained). Additionally, to extract the difference in edge sharpness and edge interval between the positive focus waveform and negative focus waveform, the calculated differentiated waveform is Fourier-transformed to calculate the power spectrum.

A learning data calculating means or step (learning data calculating unit S706 in FIG. 7) removes feature data of a region where the feature data group of positive focus and that of negative focus overlap, to increase the generality of defocus direction determination, thereby, improving the degree of separation of the two feature data groups. For example, the feature data of a waveform having a focus amount near the absolute value of the optimum focus amount is removed from learning data.

Next, feature data corresponding to the outliers of each data group is removed, thereby preventing the outliers from influencing the statistic of the two feature data groups. For example, the feature data of a waveform having an exposure largely different from the optimum exposure is removed from learning data. Alternatively, the feature data of a waveform having a focus amount largely different from the optimum focus amount is removed from learning data.

A determining means or step (determining unit S702 in FIG. 7) determines the defocus direction on the basis of the magnitude relationship between the probability that the unknown waveform is a positive focus waveform and the probability that the unknown waveform is a negative focus waveform. To implement this, the positive focus feature data group and negative focus feature data group calculated by the learning data calculating means or step are projected to a Mahalanobis space or Bayes space. With this processing, a positive focus probability space and negative focus probability space are formed. The Mahalanobis space and Bayes space assume a multidimensional normal distribution. The Bayes space is a complete multidimensional normal distribution probability spaced based on the Bayes conditional probability. On the other hand, the Mahalanobis space is a normal distribution, but not a multidimensional normal distribution, in the strict sense. This is described in detail in Ishii, Ueda, Maeda, and Murase, "Easy Pattern Recognition", Ohm-Sha Ltd., pages 51, 80, 180 and 181.

The feature data of the unknown waveform is projected to the positive focus probability space and negative focus probability space. The probability that the unknown waveform is a positive focus waveform and the probability that the unknown waveform is a negative focus waveform are calculated. On the basis of the magnitude relationship between them, the defocus direction is determined.

The embodiments of the present invention will be described below in detail with reference to the accompanying drawings.

The embodiments to be described below are mere examples of a means for implementing the present invention, and should appropriately be corrected or changed in accordance with various kinds of conditions or the arrangement of the apparatus to which the present invention is applied. The same reference numerals as those in the above-described prior art arrangements denote the same elements, in the following description.

First Embodiment

An overlay inspection apparatus, which is indispensable in practicing the present invention, will be described first.

Figure 5:
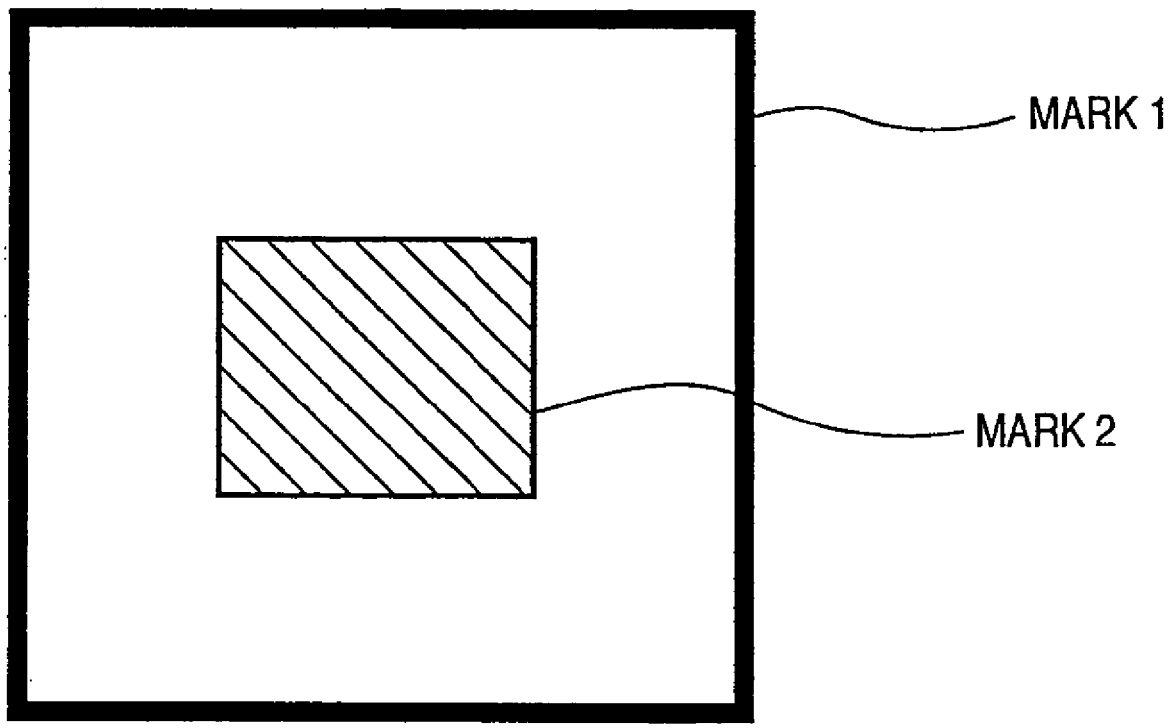
FIG. 5 is a view showing marks used in an overlay inspection apparatus.

The overlay inspection apparatus measures the alignment accuracy or distortion of a semiconductor exposure apparatus called a stepper or scanner. As shown in FIG. 5, the overlay inspection apparatus measures the relative positional relationship between existing mark 1 and new mark 2 overlaid on it.

The overlay inspection apparatus was developed during the 1980s to meet the requirements of high accuracy and mass production, along with size reduction of semiconductor devices, and was introduced in device makers on a full scale in the 1990s. Before the introduction of the overlay inspection apparatus, inspection was done by visually reading a device called a vernier based on the same principle as that of calipers, by using a microscope. Currently, overlay inspection apparatuses are available from makers in Japan and other countries. FIG. 11 shows the required alignment accuracy, and the like, of overlay inspection.

FIG. 11 is quoted from the lithography roadmap in "International Technology Roadmap for Semiconductor: ITRS 99" in 1999. A value of 10 nm or less is already required. It is to be noted that an accuracy up to 0.5 nm is required as the smallest unit. Hence, an accuracy on the sub-nanometer order must be taken into consideration.

The arrangement of the overlay inspection apparatus will be described next, with reference to FIG. 6.

Figure 6:
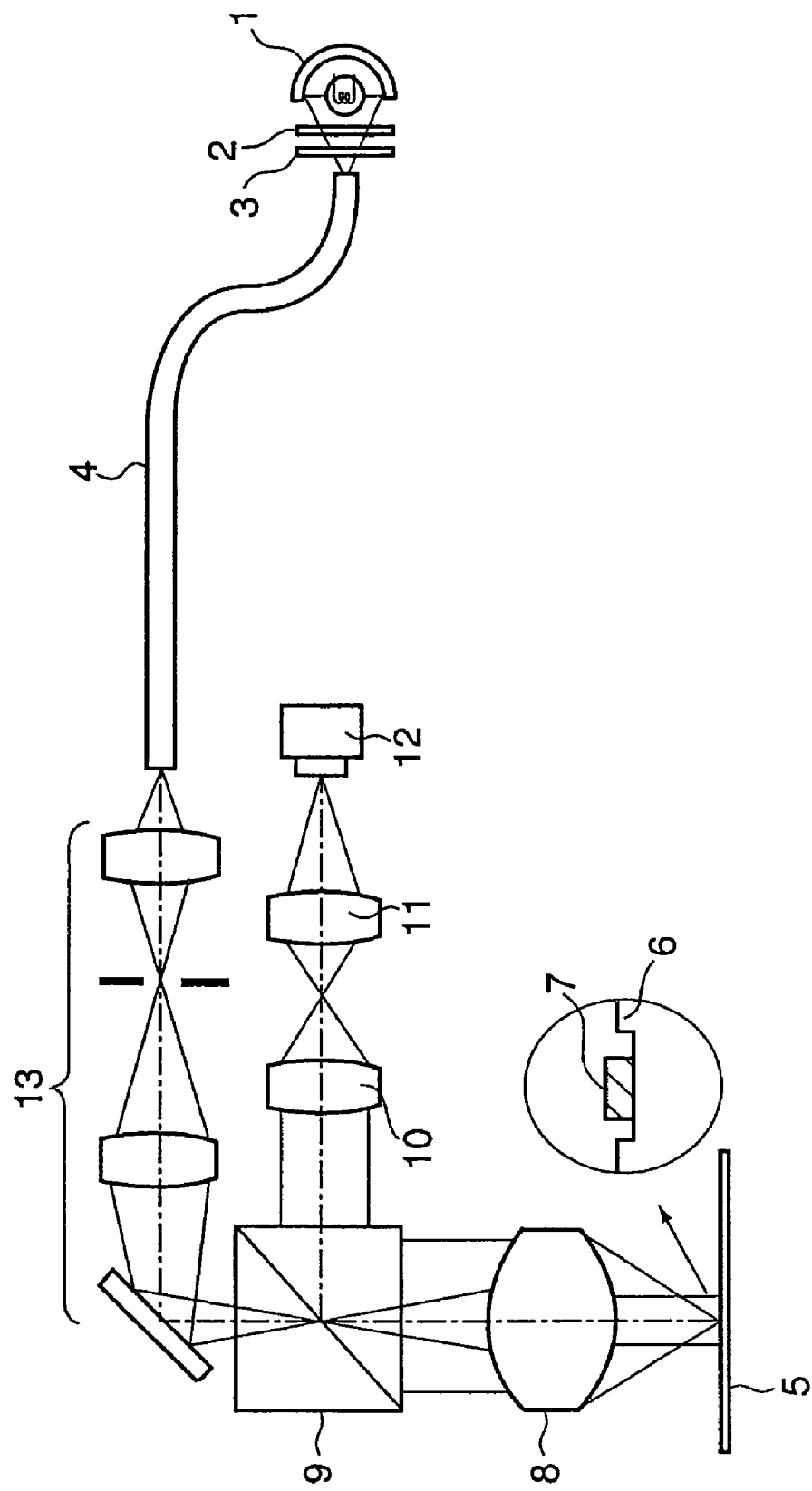
FIG. 6 is a view showing the optical system of the overlay inspection apparatus.

Referring to FIG. 6, a halogen lamp is used as a light source 1. A desired waveform band is selected by various kinds of optical filters 2 and 3. The light is guided to an optical system 13 by a fiber 4 to Koehler-illuminate marks 6 and 7 on a wafer 5. An image of the light reflected by the wafer 5 is formed on an image capturing element, such as a CCD camera 12, through optical systems 8 to 11. The image is photoelectrically converted. Various kinds of image processing are executed for the image signal to detect the relative positional relationship between the two marks 6 and 7.

Figure 12:
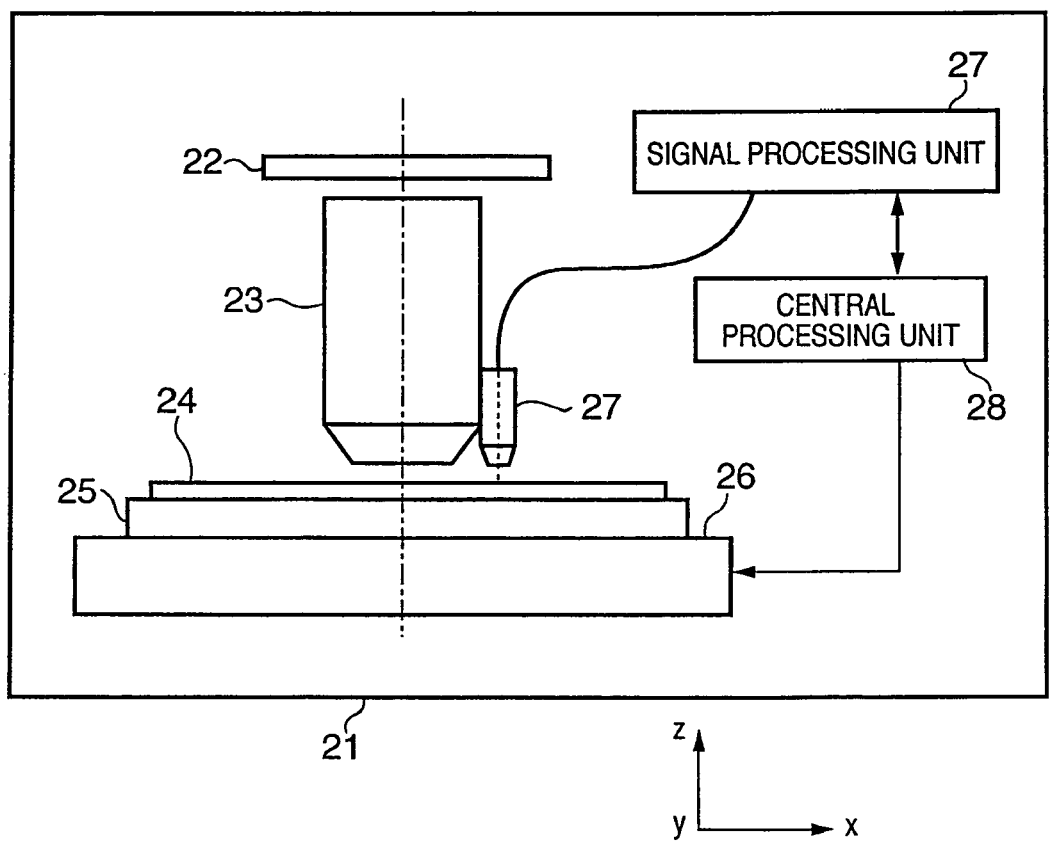
FIG. 12 is a schematic view of a semiconductor exposure apparatus including the overlay inspection apparatus shown in FIG. 6.

The principle of all commercially available currently overlay inspection apparatuses employs "bright field illumination+image processing", as in the alignment optical system of an exposure apparatus, as shown in FIG. 12.

The resolving power of the alignment detection system is estimated (because the makers have not disclosed the optical specifications). When the magnification between the wafer and the CCD camera is ×100, and the pixel pitch of the CCD camera is 10 μm, the resolving power is 100 nm/pixel on the wafer surface. Hence, the above-described accuracy of 10 nm or less is achieved here, probably, by various image processing techniques.

A defocus direction determining method according to the first of embodiment of the present invention will be described next.

Figure 7:
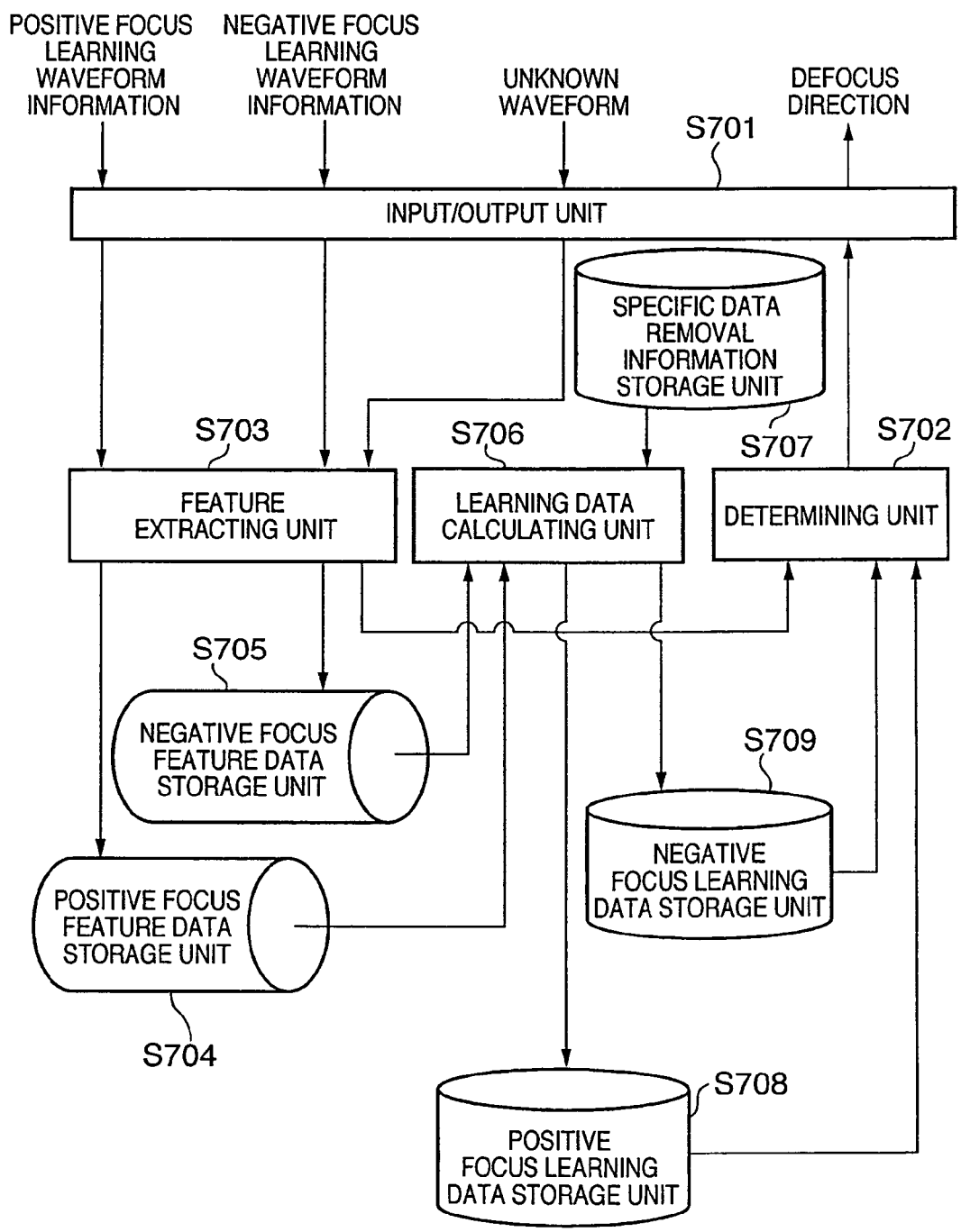
FIG. 7 is a functional block diagram for implementing a defocus direction determining method according to an embodiment.

FIG. 7 is a functional block diagram for implementing the defocus direction determining method according to the first embodiment of the present invention.

Each block may be a device including a dedicated program or processor to implement the function to be below, or may be implemented by executing a control program to control specific hardware corresponding to the function.

The outline of this embodiment will be described first with reference to FIG. 7.

An input/output unit S701 receives unknown waveform data, which is obtained at an unknown focus amount and exposure by the image capturing element 12 of the overlay inspection apparatus shown in FIG. 6, positive focus learning waveform information containing positive focus waveform data, and a focus amount and exposure obtained from an FEM wafer prepared by exposure at a predetermined focus amount and exposure, and negative focus learning waveform information containing negative focus waveform data and a focus amount and exposure obtained from an FEM wafer prepared by exposure, at a predetermined focus amount and exposure. The input/output unit S701 outputs the defocus direction of the unknown waveform calculated by a determining unit S702.

The positive focus learning waveform information and negative focus learning waveform information input from the input/output unit S701 in advance are learned as teaching data. The learning result is held by a learning data storage unit. The learning data can be updated by teaching data input at appropriate times. When the unknown waveform is input, then, the defocus direction is determined on the basis of the learning result. The determination result is output from the input/output unit S701.

A feature extracting unit S703 receives the unknown waveform, positive focus learning waveform information, or negative focus learning waveform information from the input/output unit S701. Upon receiving the unknown waveform, the feature extracting unit S703 outputs the feature data to the determining unit S702. Upon receiving the positive focus learning waveform information, the feature extracting unit S703 registers the feature data in a positive focus feature data storage unit S704 together with the focus amount and exposure. Upon receiving the negative focus learning waveform information, the feature extracting unit S703 registers the feature data in a negative focus feature data storage unit S705, together with the focus amount and exposure.

A learning data calculating unit S706 removes target data from the positive focus feature data (S704) by using the focus amount rage and exposure range, which are registered in a specific data removal information storage unit S707, and outputs obtained feature data to a positive focus learning data storage unit S708.

The learning data calculating unit S706 also removes target data from the negative focus feature data (S705) by using the focus amount range and exposure range, which are registered in the specific data removal information storage unit S707, and outputs the obtained feature data to a negative focus learning data storage unit S709.

The determining unit S702 receives the feature data of the unknown waveform calculated by the feature extracting unit S703, the feature data of the positive focus learning data (S704), and the feature data of the negative focus learning data (S705), and outputs the defocus direction of the unknown waveform to the input/output unit S701.

Each functional block will be described below in detail.

<Feature Extracting Unit S703>

Figure 8:
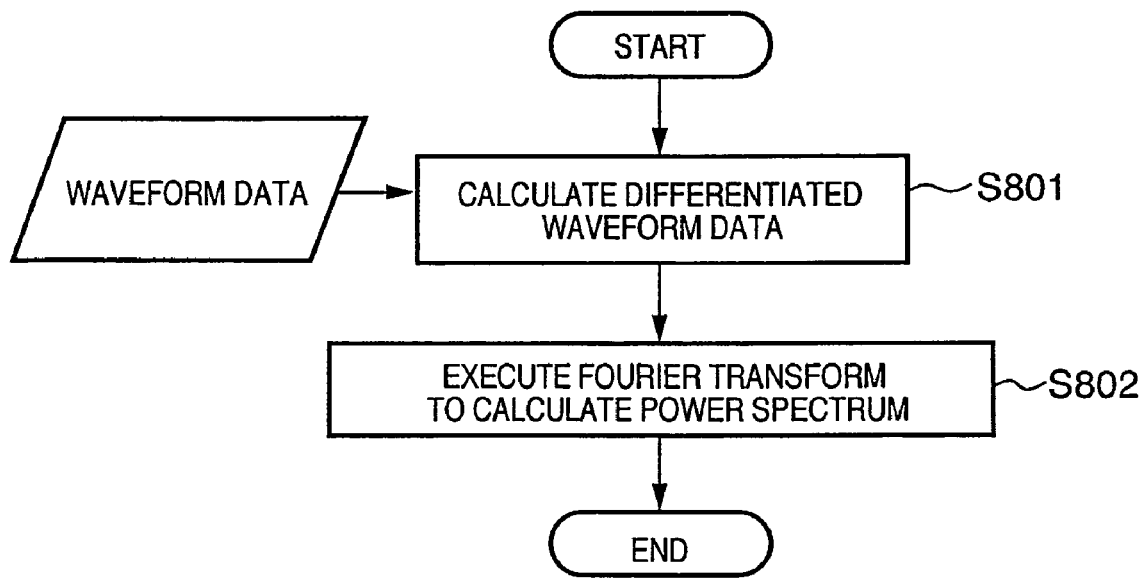
FIG. 8 is a flowchart showing the procedure of a feature extracting unit.

As shown in FIG. 8, in step S801, the feature extracting unit S703 calculates data by differentiating the unknown waveform or the waveform data of the positive focus learning waveform information or negative focus learning waveform information. In step S802, the data calculated in step S801 is Fourier-transformed to calculate the power spectrum.

<Learning Data Calculating Unit S706>

The learning data calculating unit S706 is provided to remove the feature data of a waveform having a focus amount near the optimum focus amount and to prevent overlap between the positive focus feature data group and negative focus feature data group, thereby improving the degree of separation of the two feature data groups.

Figure 9:
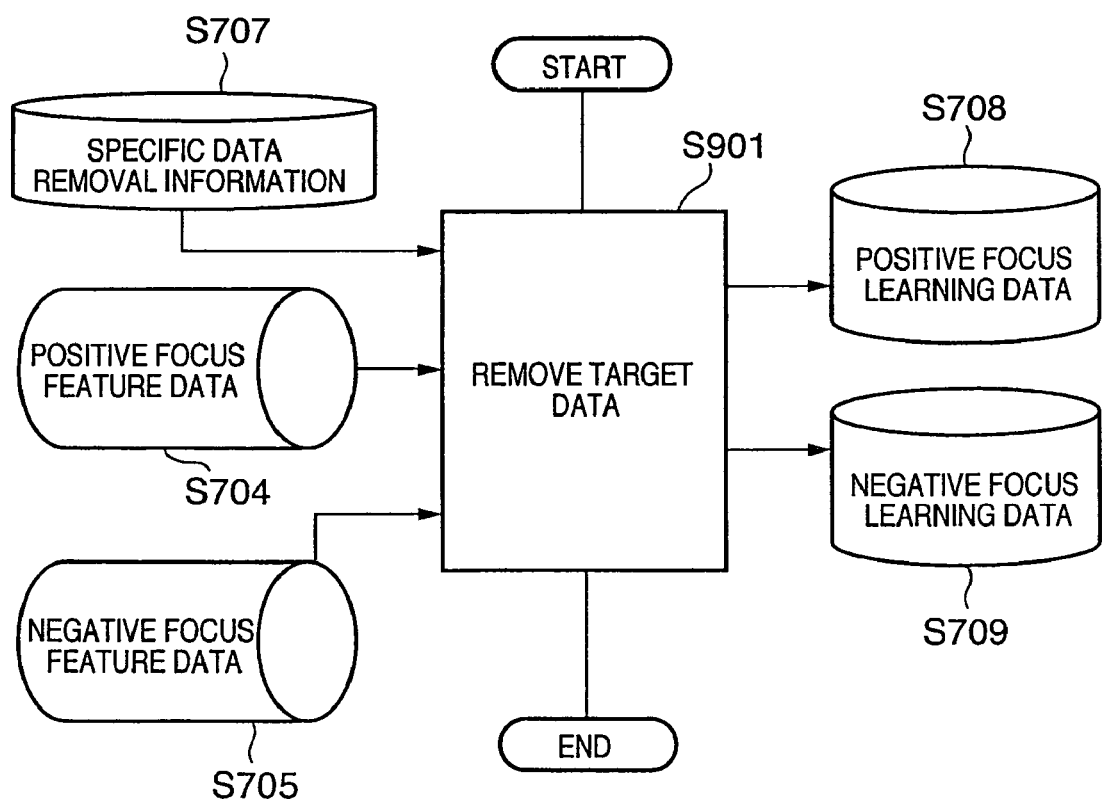
FIG. 9 is a flowchart showing the procedure of a learning data calculating unit.

More specifically, as shown in FIG. 9, in step S901, feature data at all exposures corresponding to the focus amount range, including the optimum focus amount registered in the specific data removal information storage unit S707, is removed from the positive focus feature data (S704), and the obtained feature data is output to the positive focus learning data storage unit S708.

Also, in step S901, feature data at all exposures corresponding to the focus amount range, including the optimum focus amount registered in the specific data removal information storage unit S707, is removed from the negative focus feature data (S705), and the obtained feature data is output to the negative focus learning data storage unit S709.

<Determining Unit S702>

Figure 10:
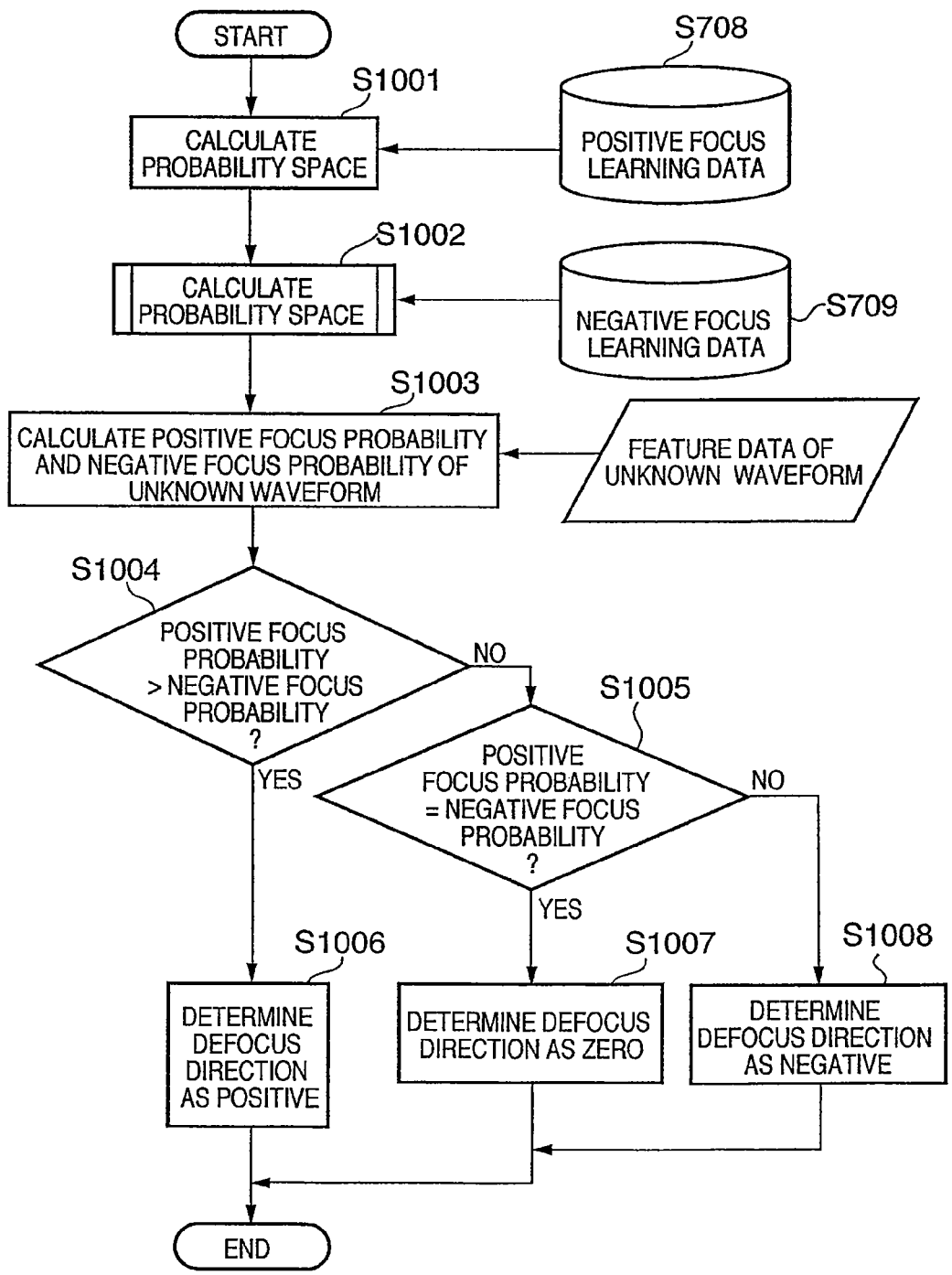
FIG. 10 is a flowchart showing the procedure of a determining unit.

As shown in FIG. 10, in step S1001, the determining unit S702 receives the positive focus feature data group of the positive focus learning data (S708) and generates a Mahalanobis space as a positive focus probability space.

In step S1002, the determining unit S702 receives the negative focus feature data group of the negative focus learning data (S709) and generates a Mahalanobis space as a negative focus probability space.

When the Mahalanobis space is used, the distance from the center of the data group can be assumed to be an occurrence probability belonging to the data group. This assumption does not hold in a Euclidean space. In addition, the calculation amount using a Mahalanobis space is smaller than the calculation amount using a Bayes space.

In step S1003, the feature data of the unknown waveform is projected to the positive focus probability space calculated in step S1001, thereby calculating the probability that the unknown waveform is a positive focus waveform. In step S1003, the feature data of the unknown waveform is also projected to the negative focus probability space calculated in step S1002, thereby calculating the probability that the unknown waveform is a negative focus waveform.

If the probability that the unknown waveform is a positive focus waveform, which is calculated in step S1003, is higher than the probability that the unknown waveform is a negative focus waveform in step S1004, information representing that the defocus direction of the unknown waveform is the positive direction is output to the input/output unit S701 (S1006). Otherwise, the processing advances to step S1005.

If the probability that the unknown waveform is a positive focus waveform, which is calculated in step S1003, equals the probability that the unknown waveform is a negative focus waveform in step S1005, information representing that the defocus direction of the unknown waveform is zero (optimum focus) is output to the input/output unit S701 (S1007). Otherwise, information representing that the defocus direction of the unknown waveform is the negative direction is output to the input/output unit S701 (S1008).

Second Embodiment

In the second embodiment, a Bayes space is used in place of the Mahalanobis space in steps S1001 and S1002 of the determining unit S702 of the first embodiment.

In the Bayes space, the distance from the center of the data group can be assumed to be an occurrence probability belonging to the data group, as in the Mahalanobis space. However, the Bayes space is a complete multidimensional normal distribution probability space based on the Bayes conditional probability. On the other hand, the Mahalanobis space is no multidimensional normal distribution in the strict sense, although each dimension is a normal distribution. For this reason, the occurrence probability when the Mahalanobis space is used contains a large error as compared to the occurrence probability when the Bayes space is used. Hence, the robustness of determination can be improved as compared to the first embodiment.

Third Embodiment

In the third embodiment, the learning data calculating unit S706 of the first embodiment has the following arrangement.

The feature data of a waveform having a focus amount largely different from the optimum focus amount corresponds to the outliers. An object of this embodiment is to remove the data from learning data to prevent the outliers from influencing the statistic of the positive focus feature data group and the statistic of the negative focus feature data group.

More specifically, in step S901 shown in FIG. 9, feature data at all exposures corresponding to the focus amount range, including the maximum focus amount registered in a specific data removal information storage unit S707, is removed from positive focus feature data (S704), and the obtained feature data is output to a positive focus learning data storage unit S708.

Also, in step S901, feature data at all exposures corresponding to the focus amount range including the maximum focus amount registered in the specific data removal information storage unit S707 is removed from negative focus feature data (S705), and the obtained feature data is output to a negative focus learning data storage unit S709.

Fourth Embodiment

In the fourth embodiment, a Bayes space is used in place of the Mahalanobis space in steps S1001 and S1002 of the determining unit S702 of the third embodiment. Even in this case, the robustness of the determination can be improved, as compared to the third embodiment, due to the reason described in the second embodiment.

Fifth Embodiment

In the fifth embodiment, the learning data calculating unit S706 of the first embodiment has the following arrangement.

The feature data of a waveform having an exposure largely different from the optimum exposure corresponds to the outliers. An object of this embodiment is to remove the data from learning data to prevent the outliers from influencing the statistic of the positive focus feature data group and the statistic of the negative focus feature data group.

More specifically, in step S901 shown in FIG. 9, feature data at all focus amounts corresponding to the exposure range, including the maximum exposure registered in a specific data removal information storage unit S707, is removed from positive focus feature data (S704), and the obtained feature data is output to a positive focus learning data storage unit S708.

Also, in step S901, feature data at all focus amounts, corresponding to the exposure range, including the maximum exposure registered in the specific data removal information storage unit S707, is removed from negative focus feature data (S705), and the obtained feature data is output to a negative focus learning data storage unit S709.

Sixth Embodiment

In the sixth embodiment, a Bayes space is used in place of the Mahalanobis space in steps S1001 and S1002 of the determining unit S702 of the fifth embodiment. Even in this case, the robustness of the determination can be improved, as compared to the fifth embodiment, due to the reason described in the second embodiment.

Seventh Embodiment

In the seventh embodiment, the learning data calculating unit S706 of the first embodiment has the following arrangement.

This embodiment has two objects.

The first object is to remove, from learning data, the feature data of a waveform having a focus amount near the absolute value of the optimum focus amount and to prevent an overlap between the positive focus feature data group and negative focus feature data group, thereby improving the degree of separation of the two feature data groups.

The second object is to remove, from learning data, the feature data of a waveform having a focus amount largely different from the optimum focus amount, to prevent the outliers from influencing the statistic of the positive focus feature data group and the statistic of the negative focus feature data group, and to remove, from learning data, the feature data of a waveform having an exposure largely different from the optimum exposure, to prevent the outliers from influencing the statistic of the positive focus feature data group and the statistic of the negative focus feature data group.

More specifically, in step S901 shown in FIG. 9, feature data at all exposures corresponding to the focus amount range, including the optimum focus amount registered in a specific data removal information storage unit S707, feature data at all exposures corresponding to the focus amount range, including the maximum defocus amount, and feature data at all focus amounts corresponding to the exposure range, including the maximum exposure, are removed from positive focus feature data (S704), and the obtained feature data is output to a positive focus learning data storage unit S708.

Also, in step S901, feature data at all exposures corresponding to the focus amount range, including the optimum focus amount registered in the specific data removal information storage unit S707, feature data at all exposures corresponding to the focus amount range, including the maximum defocus amount, and feature data at all focus amounts corresponding to the exposure range, including the maximum exposure, are removed from negative focus feature data (S705), and the obtained feature data is output to a negative focus learning data storage unit S709.

Eighth Embodiment

In the eighth embodiment, a Bayes space is used in place of the Mahalanobis space, in steps S1001 and S1002 of the determining unit S702 of the seventh embodiment. Even in this case, the robustness of the determination can be improved as compared to the fifth embodiment due to the reason described in the second embodiment.

As an effect common to the above-described embodiments, a conventional overlay inspection apparatus can be used without changing its hardware configuration.

When the above-described functions are added to the conventional overlay inspection apparatus, an overlay error, an exposure error, and a focus error can be measured as important performance of an exposure apparatus.

Hence, according to the above-described embodiments, exposure by the exposure apparatus can be done in an optimum focus state. More specifically, the conventional overlay inspection apparatus cannot determine the direction of the focus error. However, according to the above-described embodiments, the direction can be determined. For this reason, the focus error can be reduced by, e.g., setting, in the exposure apparatus, an offset value corresponding to the focus error, including the direction measured by the overlay inspection apparatus.

[Schematic Arrangement of Exposure Apparatus]

FIG. 12 is a schematic view of a semiconductor exposure apparatus including the overlay inspection apparatus shown in FIG. 6.

Referring to FIG. 12, a semiconductor exposure apparatus 21 comprises a reducing projection optical system 23, which reduces and projects a reticle 22 with a predetermined circuit pattern, a wafer chuck 25, which holds a wafer 24 on which an underlying pattern and an alignment mark are formed in the preprocess, a wafer stage 26, which aligns the wafer 24 to a predetermined position (alignment position), and an alignment optical system (alignment scope) 27 used to detect the position of the alignment mark formed on the wafer 24 and to inspect the overlay, the exposure error, and the focus error. The alignment optical system 27 can have the same arrangement as in, e.g., FIG. 6.

The alignment optical system 27 sends, to a signal processing unit 27, an image signal obtained by photoelectrically converting an optical image of the mark on the wafer 24 by the CCD camera 12. The signal processing unit 27 calculates mark position information on the basis of the image signal. On the basis of the position information calculated by the signal processing unit 27, a central processing unit 28 positions the wafer stage 26 to correct the misalignment of the wafer. The central processing unit 28 also acquires, through the alignment optical system 27, the images of various marks to measure the overlay error, the exposure error, and the focus error, and applies the method described in the above embodiments. In this way, an overlay error, an exposure error, and a focus error, including a direction, are measured.

[Device Manufacturing Method]

Figure 13:
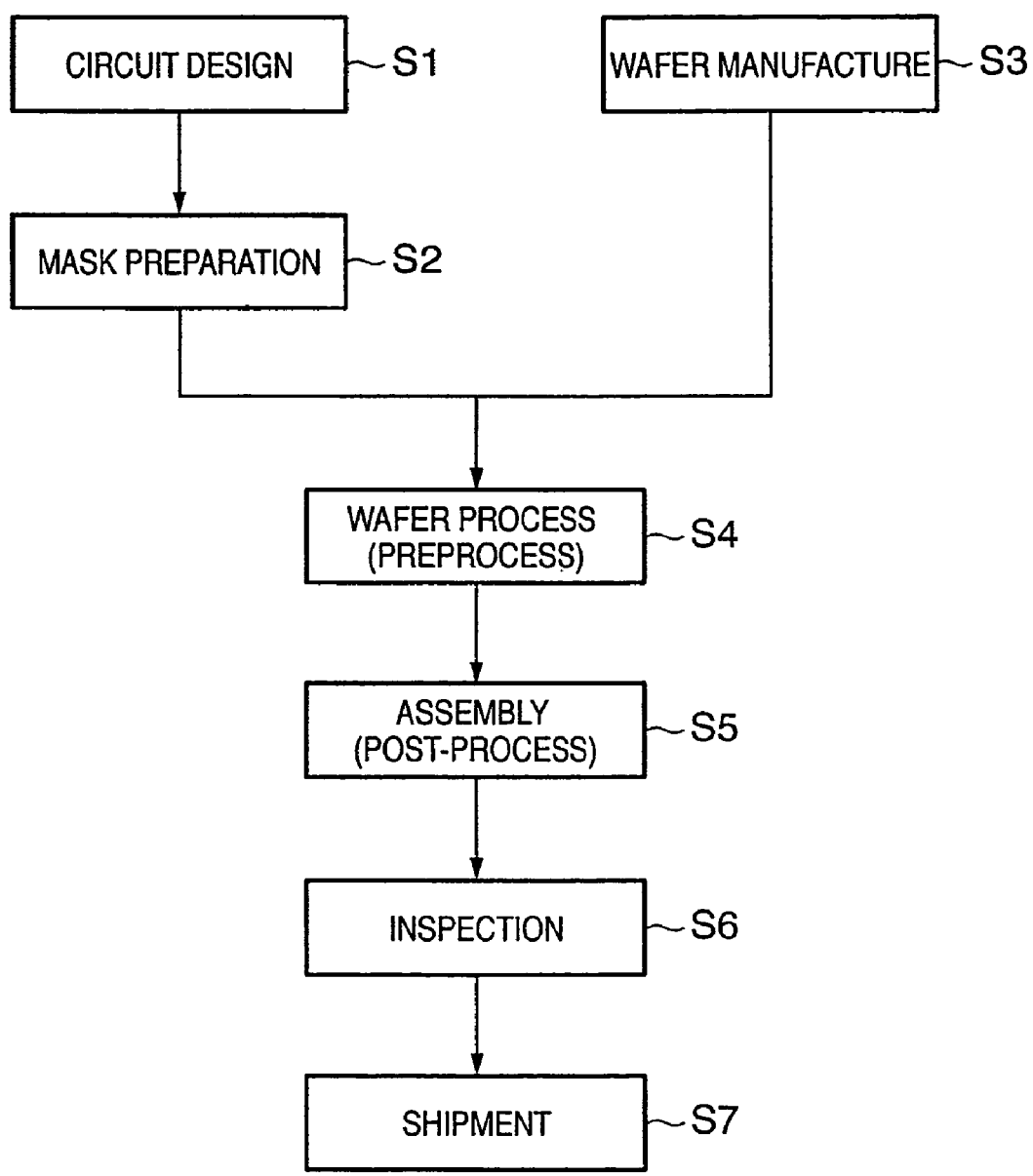
FIG. 13 is a flowchart showing a device manufacturing method.

A semiconductor device manufacturing process using the exposure apparatus of the embodiment will be described next. FIG. 13 is a flowchart showing the entire flow of the semiconductor device manufacturing process. In step S1 (circuit design), the circuit of a semiconductor device is designed. In step S2 (mask preparation), a mask is prepared on the basis of the designed circuit pattern.

In step S3 (wafer manufacture), a wafer is manufactured using a material such as silicon. In step S4 (wafer process), called a preprocess, an actual circuit is formed on the wafer by the exposure apparatus, by lithography, using the mask and wafer. In step S5 (assembly), called a post-process, a semiconductor chip is formed from the wafer prepared in step S4. The step includes assembly processes, such as assembly (dicing and bonding) and packaging (chip encapsulation). In step S6 (inspection), inspections, including an operation check test and a durability test of the semiconductor device manufactured in step S5, are performed. A semiconductor device is completed with these processes and shipped, in step S7.

Figure 14:
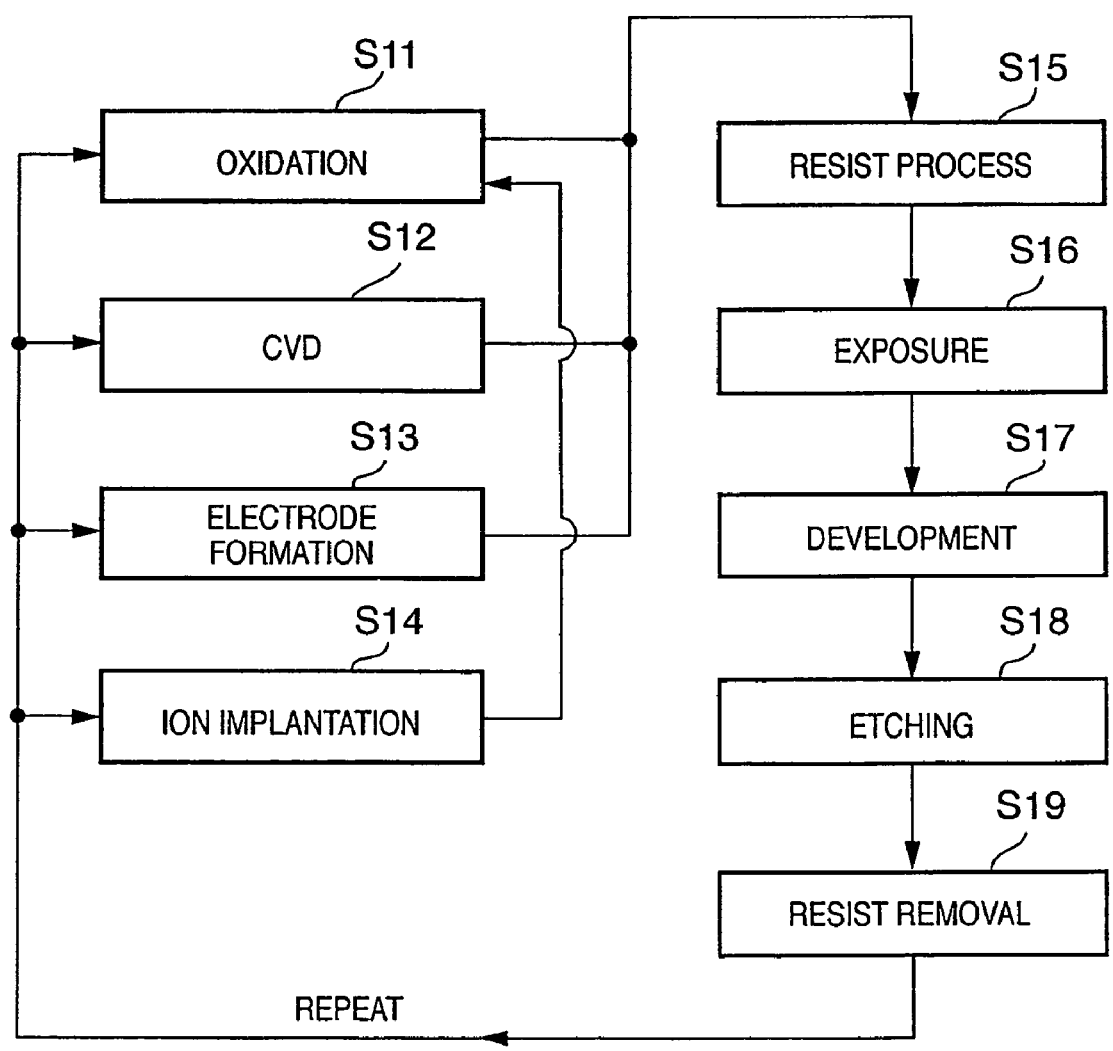
FIG. 14 is a flowchart showing a wafer process.

The wafer process in step S4 has the following steps (FIG. 14): an oxidation step of oxidizing the surface of the wafer, a CVD step of forming an insulating film on the wafer surface, an electrode formation step of forming an electrode on the wafer by deposition, an ion implantation step of implanting ions into the wafer, a resist process step of applying a photosensitizer to the wafer, an exposure step of transferring the circuit pattern to the wafer after the resist process step by the above-described exposure apparatus, a development step of developing the wafer exposed in the exposure step, an etching step of etching portions other than the resist image developed in the development step, and a resist removal step of removing any unnecessary resist remaining after etching. By repeating these steps, a multilayered structure of circuit patterns is formed on the wafer.

As many apparently widely different embodiments of the present invention can be made without departing from the spirit and scope thereof, it is to be understood that the invention is not limited to the specific embodiments thereof, except as defined in the claims.

What is claimed is:

1. A method of determining a defocus direction of a pattern image of a reticle pattern that is formed on a resist on a substrate, the pattern image being formed by an exposure apparatus for performing exposure of the resist to light by projecting light from the reticle pattern to the resist, the exposed resist being developed to form a resist pattern, the method comprising:

an image capturing step of capturing a resist image of the resist pattern to obtain image data, wherein the resist pattern includes a hollow in the resist or a solid of the resist;

an extracting step of extracting a feature of the image data to obtain extracted feature data, wherein the extracting step differentiates the image data to produce differential image data, and calculates, as the extracted feature data, a power spectrum of the differential image data;

a preparing step of preparing, in advance, plus defocus direction probability space data that is prepared with respect to image data of the resist patterns of which defocus directions are known as plus and minus defocus direction probability space data that is prepared with respect to image data of the resist patterns of which defocus directions are known as minus;

a projecting step of projecting the extracted feature data to each of the prepared plus defocus direction probability space data and the prepared minus defocus direction probability space data to obtain probability data, wherein a distance of the extracted feature data from a center of a data group in the prepared plus defocus direction probability space data corresponds to a probability that the pattern image associated with the extracted feature data has a plus defocus direction, and a distance of the extracted feature data from a center of a data group in the prepared minus defocus direction probability space data corresponds to a probability that the pattern image associated with the extracted feature data has a minus defocus direction; and a determining step of determining the defocus direction based on the probability data obtained with respect to each of the prepared plus defocus direction probability space data and the prepared minus defocus direction probability space data.

2. A method according to claim 1, wherein each of the prepared plus defocus probability space data and the prepared minus defocus direction probability space data includes one of Mahalanobis space data and Bayes space data.

3. A method according to claim 1, wherein the determining step determines the defocus direction based on a magnitude relation between the probability data respectively obtained with respect to the prepared plus defocus direction probability space data and the prepared minus defocus direction probability space data.

4. A method according to claim 1, wherein the resist patterns, from which one of the plus defocus direction probability space data and the minus defocus direction probability space data is prepared in advance, are obtained with respect to a plurality of values of at least one of a defocus amount and a dose of the exposure.

5. An apparatus for determining a defocus direction of a pattern image of a reticle pattern that is formed on a resist on a substrate, the pattern image being formed by an exposure apparatus for performing exposure of the resist to light by projecting light from the reticle pattern to the resist, the exposed resist being developed to form a resist pattern, the apparatus comprising:

a camera configured to capture a resist image of the resist pattern to obtain image data, wherein the resist pattern includes a hollow in the resist or a solid of the resist; and a processor configured (i) to differentiate the image data to produce differentiated image data, (ii) to calculate a power spectrum of the differentiated image data to obtain extracted feature data, (iii) to prepare plus focus direction probability space data that is prepared with respect to known image data of the resist patterns of which defocus directions are known as plus and minus defocus direction probability space data that is prepared with respect to image data of the resist patterns of which defocus directions are known as minus, (iv) to project the extracted feature data to each of the prepared plus defocus direction probability space data and the prepared minus defocus direction probability space data to obtain probability data, wherein a distance of the extracted feature data from a center of a data group in the prepared plus defocus direction probability space data corresponds to a probability that the pattern image associated with the extracted feature data has a plus defocus direction, and a distance of the extracted feature data from a center of a data group in the prepared minus defocus direction probability space data corresponds to a probability that the pattern image associated with the extracted feature data has a minus defocus direction, and (v) to determine the defocus direction based on the probability data obtained with respect to each of the prepared plus focus direction probability space data and the prepared minus defocus direction probability space data.

6. An apparatus according to claim 5, wherein the processor is configured to store the prepared plus defocus probability space data and the prepared minus defocus direction probability space data, each of which includes one of Mahalanobis space data and Bayes space data.

7. An apparatus according to claim 5, wherein the processor is configured to determine the defocus direction based on a magnitude relation between the probability data respectively obtained with respect to the prepared plus defocus direction probability space data and the prepared minus defocus direction probability space data.

8. An apparatus according to claim 5, wherein the resist patterns, from which one of the plus defocus direction probability space data and the minus defocus direction probability space data is prepared in advance, are obtained with respect to a plurality of values of at least one of a defocus amount and a dose of the exposure.

9. An exposure apparatus for exposing a resist on a substrate to light by projecting light from a reticle pattern to the resist, the apparatus comprising:

an apparatus defined in claim 5.

10. A method of manufacturing a device, the method comprising:

exposing a resist on a substrate to light by projecting light from a reticle pattern to the resist using an exposure apparatus defined in claim 9;

developing the exposed substrate; and processing the developed substrate to manufacture the device.

11. A method of determining a defocus direction of a pattern image, formed by an exposure apparatus by projecting light from a reticle pattern to a resist to form a resist pattern, using plus defocus direction probability space data prepared with respect to image data of the resist patterns of which defocus directions are known as plus and minus defocus direction probability space data that is prepared with respect to image data of the resist patterns of which defocus directions are known as minus, the method comprising:

(a) an image capturing step of capturing a resist image of the resist pattern, including a hollow in the resist or a solid of the resist, to obtain image data;

(b) an extracting step of extracting a feature of the image data including:

(i) differentiating the image data to produce differential image data, and (ii) calculating a power spectrum of the differential image data to obtain extracted feature data;

(c) a projecting step of projecting the extracted feature data to each of the prepared plus defocus direction probability space data and the prepared minus defocus direction probability space data to obtain probability data, wherein a distance of the extracted feature data from a center of a data group in the prepared plus defocus direction probability space data corresponds to a probability that the pattern image associated with the extracted feature data has a plus defocus direction, and a distance of the extracted feature data from a center of a data group in the prepared minus defocus direction probability space extracted feature data has a minus defocus direction; and (d) a determining step of determining the defocus direction based on the probability data obtained with respect to each of the prepared plus defocus direction probability space data and the prepared minus defocus direction probability space data.

12. An apparatus for determining a defocus direction of a pattern image, formed by an exposure apparatus by projecting light from a reticle pattern to a resist to form a resist pattern, using plus defocus direction probability space data prepared with respect to image data of the resist patterns of which defocus directions are known as plus and minus defocus direction probability space data that is prepared with respect to image data of the resist patterns of which defocus directions are known as minus, the apparatus comprising:

a camera configured to capture a resist image of the resist pattern to obtain image data, wherein the resist pattern includes a hollow in the resist or a solid of the resist; and a processor configured (i) to differentiate the image data to produce differentiated image data, (ii) to calculate a power spectrum of the differentiated image data to obtain extracted feature data, (iii) to project the extracted feature data to each of the prepared plus defocus direction probability space data to obtain probability data, wherein a distance of the extracted feature data from a center of a data group in the prepared plus defocus direction probability space data corresponds to a probability that the pattern image associated with the extracted feature data has a plus defocus direction, and a distance of the extracted feature data from a center of a data group in the prepared minus defocus direction probability space extracted feature data has a minus defocus direction, and (iv) to determine the defocus direction based on the probability data obtained with respect to each of the prepared probability space data, from a center of a data group in the prepared plus defocus direction probability space data and the prepared minus defocus direction probability space data.

* * * * *